(12) United States Patent
Singh et al.

(10) Patent No.: US 9,437,713 B2
(45) Date of Patent: Sep. 6, 2016

(54) DEVICES AND METHODS OF FORMING HIGHER TUNABILITY FINFET VARACTOR

(71) Applicant: GLOBALFOUNDRIES INC., Grand Cayman (KY)

(72) Inventors: Jagar Singh, Clifton Park, NY (US); Andy Wei, Queensbury, NY (US); Gopal Srinivasan, Castro Valley, CA (US); Amaury Gendron, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/181,790

(22) Filed: Feb. 17, 2014

(65) Prior Publication Data
US 2015/0236133 A1 Aug. 20, 2015

(51) Int. Cl.
*H01L 29/66* (2006.01)
*H01L 29/78* (2006.01)
*H01L 21/308* (2006.01)
*H01L 29/94* (2006.01)
H01L 27/06 (2006.01)

(52) U.S. Cl.
CPC ..... *H01L 29/66795* (2013.01); *H01L 21/3086* (2013.01); *H01L 29/785* (2013.01); *H01L 29/94* (2013.01); *H01L 27/0629* (2013.01)

(58) Field of Classification Search
CPC .............. H01L 29/785; H01L 21/823431; H01L 21/3086; H01L 21/845
See application file for complete search history.

(56) References Cited

U.S. PATENT DOCUMENTS

| 2007/0249174 A1* | 10/2007 | Yang ................ H01L 21/0334 438/712 |
| 2014/0273363 A1* | 9/2014 | Chiu et al. .................... 438/165 |
| 2015/0076615 A1* | 3/2015 | Erickson et al. ............. 257/377 |

* cited by examiner

*Primary Examiner* — Thanhha Pham
(74) *Attorney, Agent, or Firm* — Heslin Rothenberg Farley & Mesiti P.C.; Jacquelyn A Graff

(57) ABSTRACT

Devices and methods for forming semiconductor devices with wider FinFETs for higher tunability of the varactor are provided. One method includes, for instance: obtaining an intermediate semiconductor device; applying a spacer layer over the semiconductor device; etching the semiconductor device to remove at least a portion of the spacer layer to expose the plurality of mandrels; removing the mandrels; etching the semiconductor device to remove a portion of the dielectric layer; forming at least one fin; and removing the spacer layer and the dielectric layer. One intermediate semiconductor device includes, for instance: a substrate; a dielectric layer over the substrate; a plurality of mandrels formed on the dielectric layer, the mandrels including a first set of mandrels and a second set of mandrels, wherein the first set of mandrels have a width twice as large as the second set of mandrels; and a spacer layer applied over the mandrels.

11 Claims, 9 Drawing Sheets

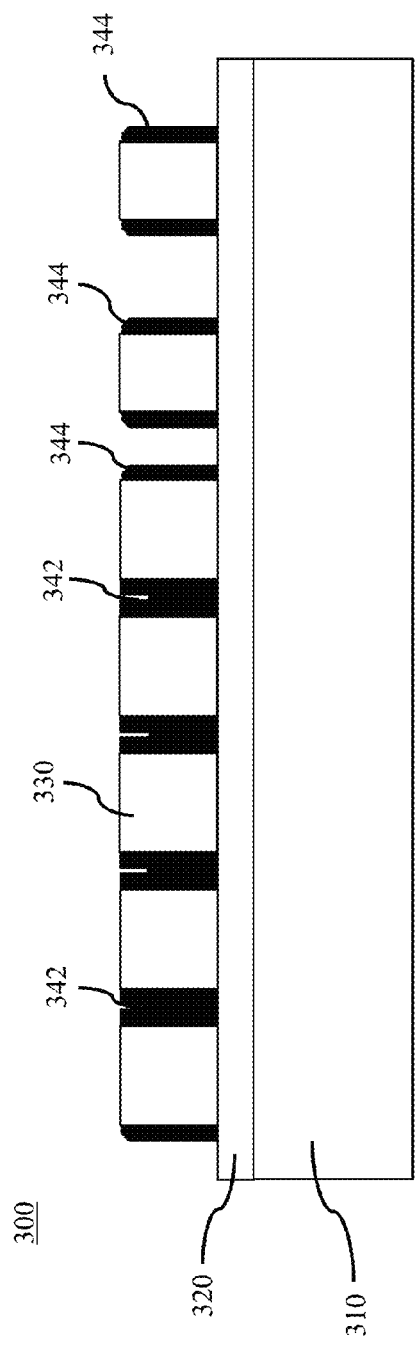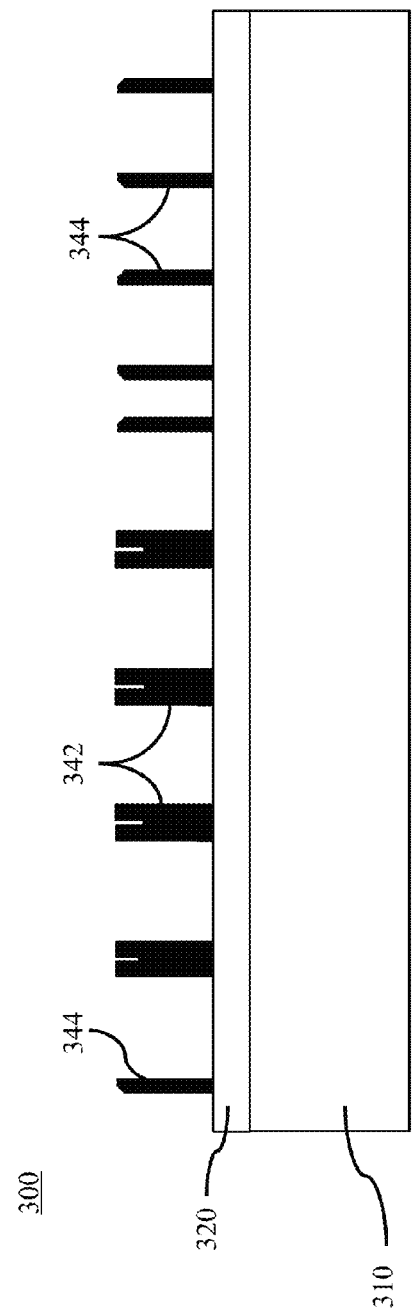
FIG. 5
FIG. 6

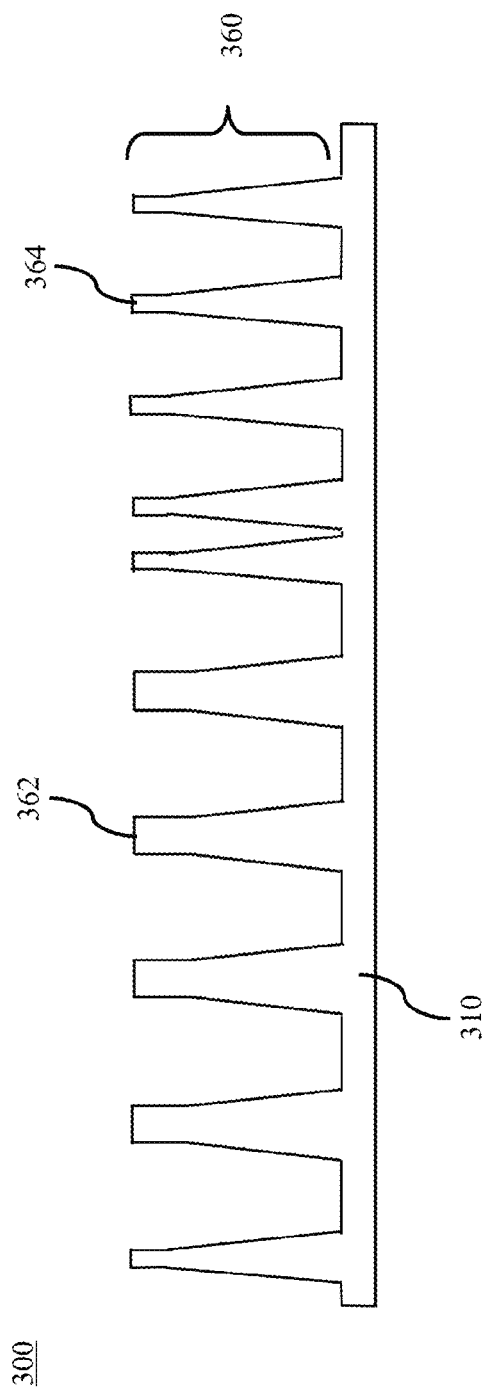
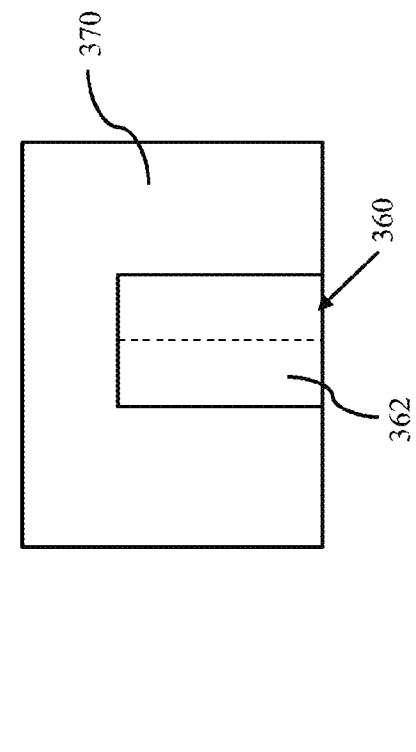
FIG. 9
FIG. 10

DEVICES AND METHODS OF FORMING HIGHER TUNABILITY FINFET VARACTOR

FIELD OF THE INVENTION

The present invention relates to semiconductor devices and methods of fabricating semiconductor devices, and more particularly, to forming wider FinFETs with higher tunability of the varactor and the methods of fabricating semiconductor devices having wider FinFETs.

BACKGROUND OF THE INVENTION

The designers of many devices that incorporate semiconductors desire integrated circuits that have large tuning ratios of accumulation to inversion. Semiconductor devices, such as integrated circuits, may include varactors which have a capacitance element that is dependent on the applied voltage. The varactors generally rely on large capacitance differences between Vg=0V and Vg>Vt to provide a tunable capacitance. Currently available FinFET devices are fully depleted devices that include depletion region widths that are limited by the width of the device fins and the current FinFET devices and fabrication methods do not enable a designer to alter the fin width. The gate capacitance swing from Vg=0V to Vg>Vt, in the currently available FinFET devices, is very small because the fin widths are small. The fin widths in FinFET devices also result in the fins being generally fully depleted at Vg=0V.

Thus, the currently available FinFET devices do not have large tuning ratios and design and fabrication methods are needed to form FinFET devices with larger fin widths to improve electrical performance of the resultant semiconductor devices by forming a higher tunability FinFET varactor.

BRIEF SUMMARY

The shortcomings of the prior art are overcome and additional advantages are provided through the provision, in one aspect, a method includes, for instance: obtaining an intermediate semiconductor device; applying a spacer layer over the intermediate semiconductor device; etching the intermediate semiconductor device to remove at least a portion of the spacer layer to expose the plurality of mandrels; removing the plurality of mandrels; etching the intermediate semiconductor device to remove at least a portion of the dielectric layer; forming at least one fin; and removing the spacer layer and the dielectric layer.

In another aspect, an intermediate semiconductor device which includes, for instance: a substrate; a dielectric layer over the substrate; a plurality of mandrels formed on the dielectric layer, the plurality of mandrels including a first set of mandrels and a second set of mandrels, wherein the first set of mandrels have a width twice as large as the second set of mandrels; and a spacer layer applied over the plurality of mandrels.

In yet another aspect, a device is provided which includes, for instance: a semiconductor substrate; and a plurality of fin structures coupled to the semiconductor substrate, wherein each fin structure of the plurality of fin structures has a width and a fin pitch.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5 depicts a cross section of a portion of the intermediate structure of FIG. 4 after removal of at least a portion of the spacer material from over the plurality of sacrificial mandrels, in accordance with one or more aspects of the present invention;

FIG. 6 depicts a cross section of a portion of the intermediate structure of FIG. 5 after removal of the plurality of sacrificial mandrels between the spacers, in accordance with one or more aspects of the present invention;

FIG. 9 depicts a cross section of a portion of the intermediate structure of FIG. 8 after removal of the spacer and dielectric layers, in accordance with one or more aspects of the present invention;

FIG. 10 depicts a cross section of a portion of another embodiment of an intermediate semiconductor device with a double fin width and a gate, in accordance with one or more aspects of the present invention;

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain novel FinFET device formation methods and FinFET structures, which provide advantages over the above noted, existing FinFET device fabrication processes and structures. Advantageously, the FinFET device fabrication processes disclosed herein provide for FinFET devices with double the fin width at various fin pitches, by way of specific example, a fin width ranging from approximately 10-40 nm with a fin pitch of approximately 100 nm for a 20 nm or smaller technology node.

Figure 1:
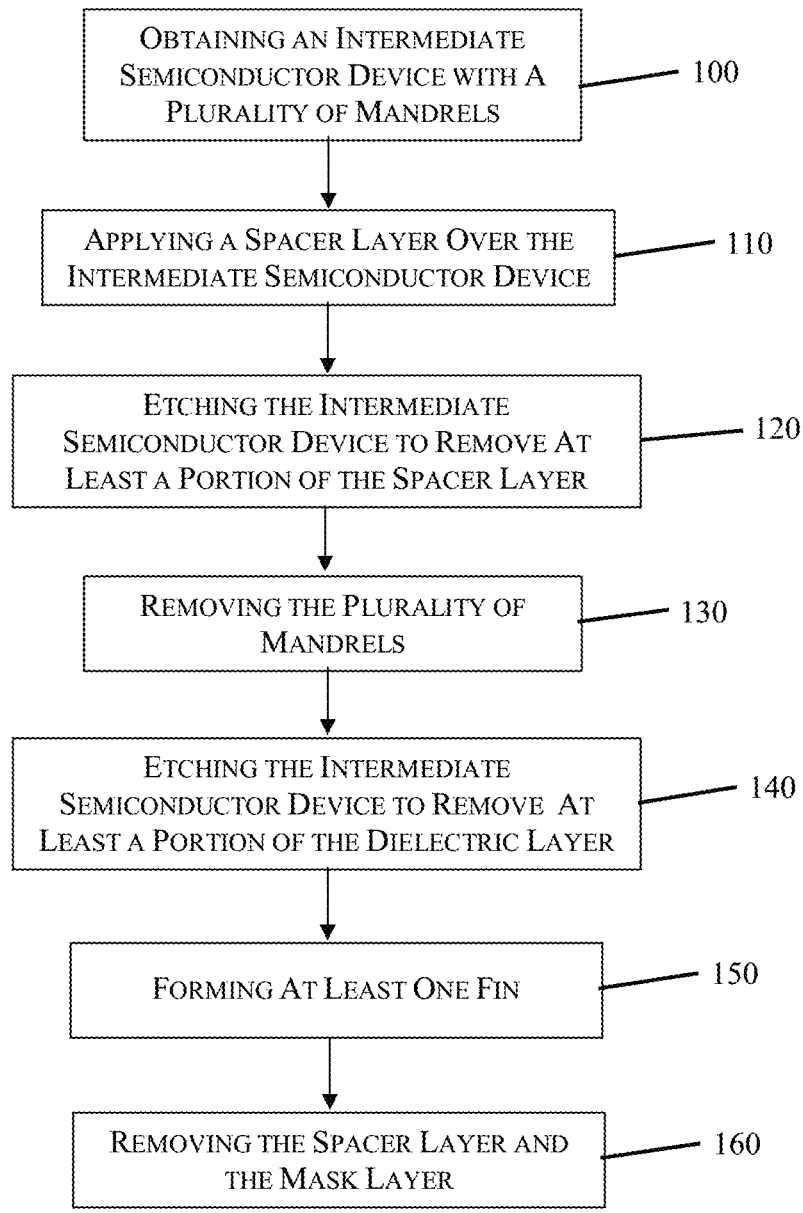
FIG. 1 depicts one embodiment of a process for fabricating, for instance, a device with at least one fin with a double fin width, in accordance with one or more aspects of the present invention.

In one aspect, in one embodiment, as shown in FIG. 1, FinFET device formation in accordance with one or more aspects of the present invention may include, for instance: obtaining an intermediate semiconductor device with a plurality of mandrels 100; applying a spacer layer over the intermediate semiconductor device 110; etching the intermediate semiconductor device to remove at least a portion of the spacer layer 120; removing the plurality of mandrels 130; etching the intermediate semiconductor device to remove at least a portion of the dielectric layer 140; forming at least one fin 150; and removing the spacer layer and the dielectric layer from the at least one fin 160.

Figure 2:
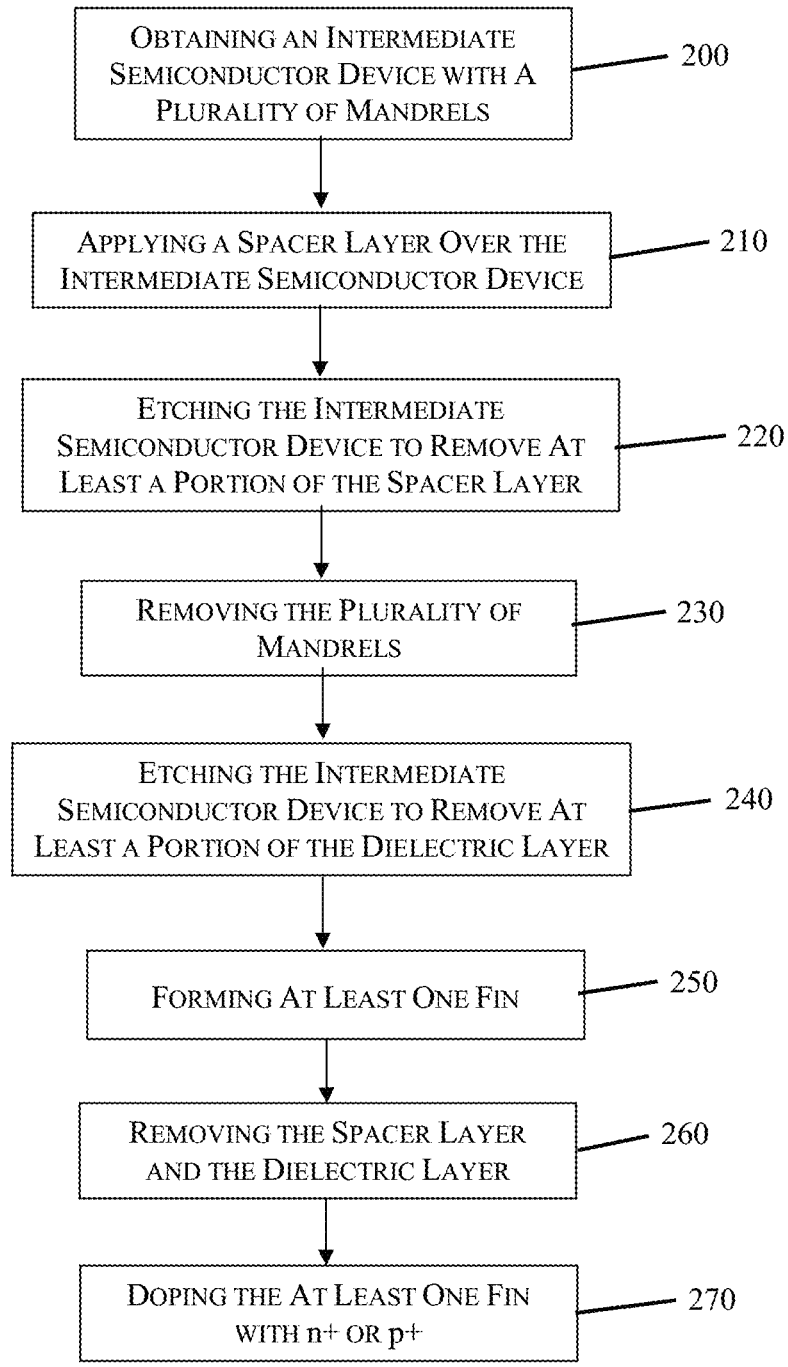
FIG. 2 depicts another embodiment of a process for fabricating, for instance, a device with a doped fin having a double fin width, in accordance with one or more aspects of the present invention.

The process shown in FIG. 1 is inherent in the more detailed FinFET structure formation process shown in FIG. 2. Specifically, the process of FIG. 1 is inherent in the process of FIG. 2. The FinFET formation process of FIG. 2 is in accordance with one or more aspects of the present invention and may include, for instance: obtaining an intermediate semiconductor device with a plurality of mandrels 200; applying a spacer layer over the intermediate semiconductor device 210; etching the intermediate semiconductor device to remove at least a portion of the spacer layer 220; removing the plurality of mandrels 230; etching the intermediate semiconductor device to remove at least a portion of the dielectric layer 240; forming at least one fin 250; removing the spacer layer and the dielectric layer from the at least one fin 260; and doping the at least one fin with n+ or p+ implants 270.

FIGS. 3-10 depict, by way of example only, one detailed embodiment of a portion of a FinFET device formation process, and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 3:
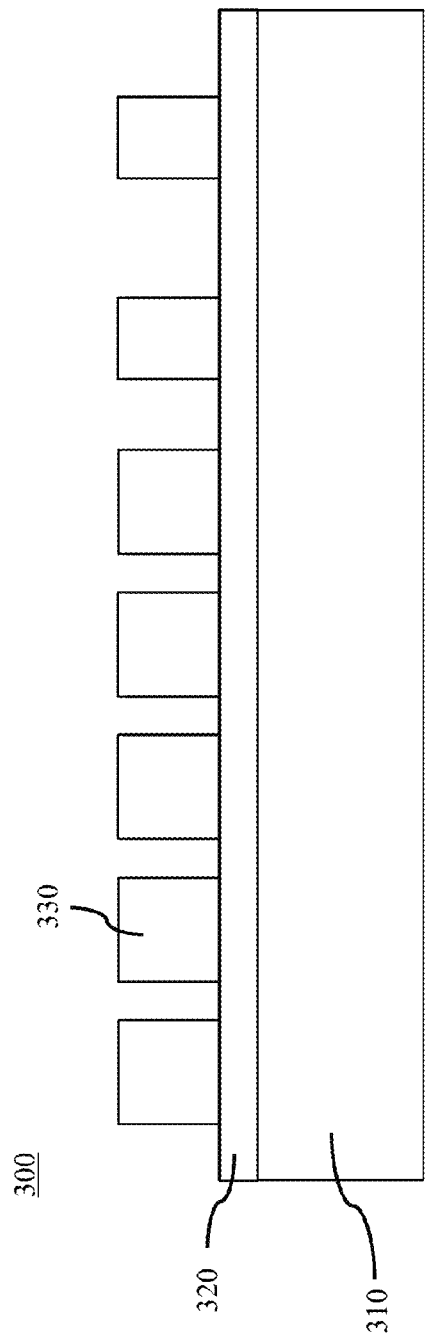
FIG. 3 depicts a cross section of a portion of one embodiment of an intermediate structure of a semiconductor device with a substrate, a dielectric layer disposed over the substrate, and a plurality of sacrificial mandrels, in accordance with one or more aspects of the present invention.

A semiconductor device structure 300 is schematically illustrated in FIG. 3 and may have been processed through various initial device processing steps in accordance with the design of the semiconductor device being fabricated, for example, shallow trench isolation (STI), n/p well formation, or other processes. As depicted in FIG. 3, the semiconductor structure 300 may include a substrate 310 which may be made of, for example, a semiconductor material. The semiconductor material may include, e.g., silicon (Si), germanium (Ge), a compound semiconductor material, and a layered semiconductor material. The semiconductor structure 300 may also have various isolation regions, doped regions, and/or other device features.

A dielectric layer 320 may be disposed over the substrate 310 using any conventional deposition process, for example, chemical-vapor deposition (CVD), physical vapor deposition (PVD), atomic layer deposition (ALD), or the like. The dielectric layer 320 may be, for example, silicon mononitride (SiN), silicon dioxide ($SiO_2$), or another high-k material, such as, hafnium oxide ($HfO_2$), aluminum oxide ($Al_2O_3$), hafnium aluminum oxide ($HfAlO_2$), zirconium dioxide ($ZrO_2$), zirconium oxide (ZrO), silicon nitride ($Si_3N_4$), silicon oxynitride (SiON), and the like. The thickness of the dielectric layer 320 will be dependent on the size of the technology node being used and the fabrication processes being performed. The thickness of the dielectric layer 320 may be, for example, approximately 0.5 nm to 5 nm for a 20 nm or smaller technology node.

A sacrificial mandrel material may then be patterned over the dielectric layer 320 to form a plurality of mandrels 330. The mandrels 330 may be formed using a conventional deposition process, for example, CVD, PVD, ALD, or the like. The sacrificial mandrel material may be, for example, amorphous silicon or polycrystalline silicon. The mandrels 330 may have a width larger than the standard mandrel width and the mandrels 330 may be printed at any pitch, such as, a standard pitch or closer together. By way of specific example, the mandrels 330 may have a width ranging from, for example, about 60 nm to 90 nm for a fin width of about 10 nm to 40 nm with a pitch of about 100 nm. Depending on the pattern design of the semiconductor structure 300 the space between the mandrels 330 may have varying widths, thus changing at least one of the mandrel pitch and fin width.

Figure 4:
FIG. 4 depicts a cross section of a portion of the intermediate structure of FIG. 3 after application of a spacer material over the plurality of sacrificial mandrels, in accordance with one or more aspects of the present invention.

As shown in FIG. 4, a sidewall spacer material 340 may be deposited over the mandrels 330 and the semiconductor structure 300. The sidewall spacer material 340 may be, for example, an oxide material, such as, silicon oxide ($SiO_2$). The sidewall spacer material 340 may be deposited by, for example, ALD, CVD, and the like. As shown in FIG. 4, the sidewall spacer material 340 may merge together when two adjacent mandrels 330 are positioned close together.

At least a portion of the sidewall spacer material 340 may be removed from above the mandrels 330 to expose the top surface of the mandrels 330, as shown in FIG. 5. In addition, the horizontal sections of the sidewall spacer material 340 may be removed from above the dielectric layer 320. The sidewall spacer material 340 may be removed by, for example, an etching process. The etching process may allow for the sidewall spacer material 340 to be left along the vertical sides of the mandrels 340 to enable the formation of one or more spacers 342, 344. The first spacers 342 are formed when adjacent mandrels 330 are positioned closer together allowing for the spacer material 340 on the vertical walls of the mandrels 330 to merge. Where adjacent mandrels 330 are positioned farther apart the second spacers 344 may form and be, for example, a single width sidewall spacer 344. The first spacers 342 may be, for example, at least double the width of second spacers 344.

As shown in FIG. 6, the mandrels 330 may be etched to remove the sacrificial mandrel material from between the spacers 342, 344 to expose the dielectric layer 320 below the mandrels 330. The sacrificial mandrel material may be removed from the device 300 by a selective etch process that may be, for example, one or more anisotropic or dry-etch processes, which may include, for example oxygen strip or plasma etching. When the sacrificial mandrel material is removed the spacers 342, 344 are exposed. The spacers 342 may have a width of, for example, about 10 nm to 40 nm, while the spacers 344 may have a width of, for example, about 5 nm to 20 nm.

Figure 7:
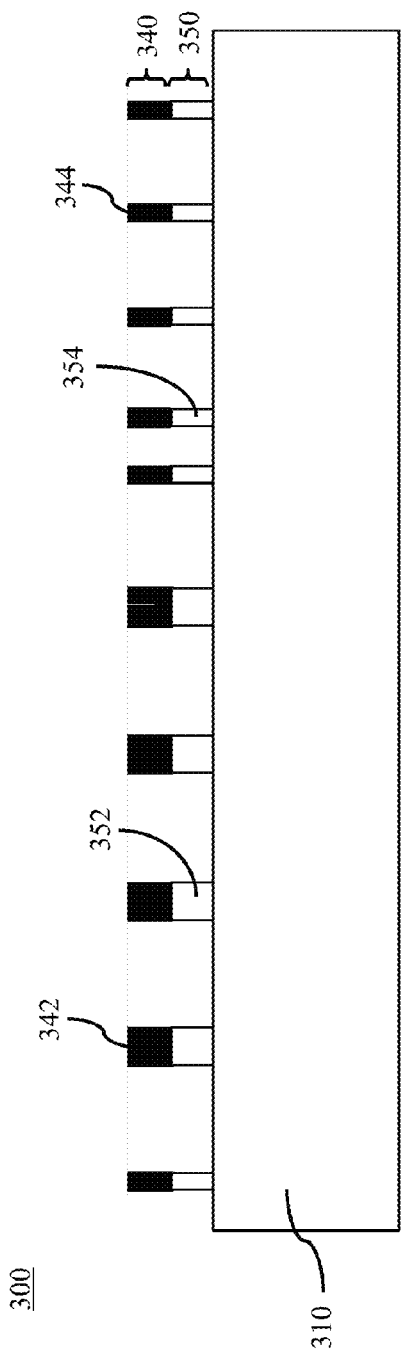
FIG. 7 depicts a cross section of a portion of the intermediate structure of FIG. 6 after patterning of the dielectric layer, in accordance with one or more aspects of the present invention.

Once the spacers 342, 344 are exposed the dielectric layer 320 may be patterned to create a mask pattern 350 for forming the fins, as described in greater detail below. As shown in FIG. 7, the mask pattern 350 is formed based on the size and location of the spacers 342, 344. Thus, the mask pattern 350 may include at least a first set of masks 352 and a second set of masks 354, where the first set of masks 352 is larger than the second set of masks 354. The width of the first set of masks 352 corresponds with the width of the first spacers 342 and the width of the second set of masks 354 corresponds with the width of the second spacers 344. A conventional etching process, such as, reactive ion etching or plasma etching may be used to pattern the dielectric layer 320.

Figure 8:
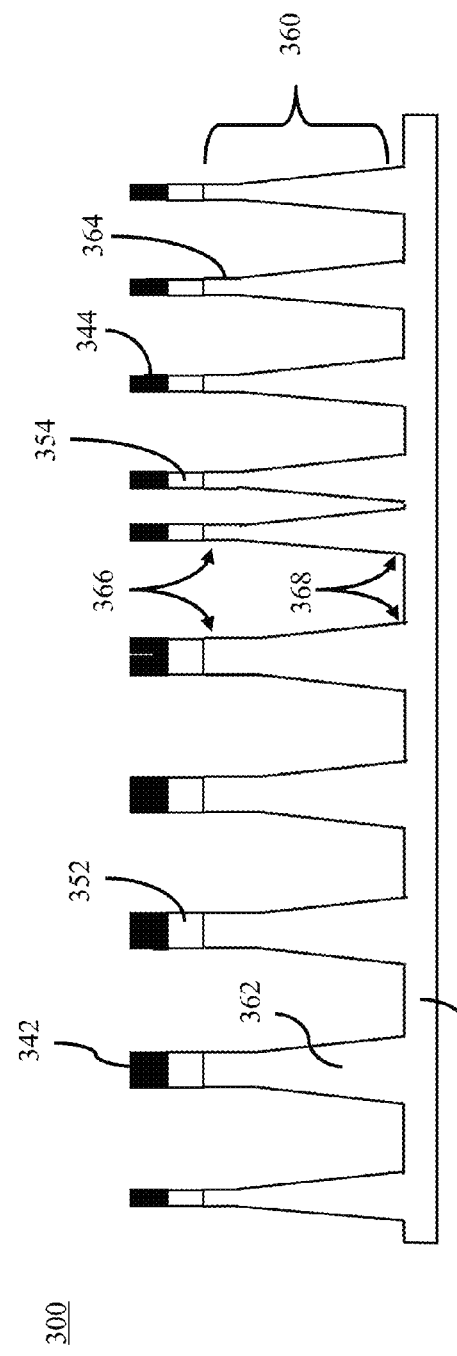
FIG. 8 depicts a cross section of a portion of the intermediate structure of FIG. 7 after patterning of the substrate to create raised semiconductor structures, in accordance with one or more aspects of the present invention.

As shown in FIG. 8, one or more additional etching processes may then be performed using the spacers 342, 344 and the mask pattern 350 to etch into the substrate 310. The etching process may be, for example, a silicon etching process. When the substrate 310 is etched one or more raised structures 360, for example, semiconductor fins, are formed into a portion of the substrate 310 leaving a bottom layer of the substrate 310 which provides a base for attachment of the bottom portion 368 of each of the raised structures 360. In the depicted embodiment, there are a first set of raised structures 362 and a second set of raised structures 364, although any number of sets of raised structures are contemplated based on the semiconductor device design. By way of specific example, the first set of raised structures 362 may have been formed under the first spacers 342 and first set of masks 352. The structures 362 may have a width at a top portion 366 that is approximately the same size as the width of the first spacers 342 and the first set of masks 352, such as, for example, about 10 nm to 40 nm. Likewise, the second set of raised structures 364 may have been formed under the second spacers 344 and the second set of masks 354. The structures 364 may have a width at a top portion 366 that is approximately the same size as the width of the second spacers 344 and the second set of masks 354, such as, for example, about 5 nm to 20 nm. The width of the structures 362, 364 may gradually increase from the top portion 366 to a bottom portion 368 of the structures 362, 364. In one embodiment, the first set of raised structures 362 may be larger than the second set of raised structures 364, for example, the first set of raised structures 362 may be about twice as large as the second set of raised structures 364. By way of specific example, the first set of raised structures 362 may have, for example, a width at a top portion 366 of approximately 10-40 nm with a fin pitch of about 100 nm, while the second set of raised structures 364 may have, for example, a width at a top portion 366 of approximately 5-20 nm with a fin pitch of about 50 nm.

After formation of the raised structures 360, the sidewall spacers 342, 344 and the mask pattern 350 may be removed from above the raised structures 360, as shown in FIG. 9. The spacers 342, 344 and mask pattern 350 may be removed by, for example, a non-selective chemical-mechanical polish or a non-selective etching. Etching the dielectric layer 320 may be done with, for example, a chlorine based material that is highly selective to nitrogen and/or oxygen. Once the spacers 342, 344 and mask pattern 350 are removed, the semiconductor device 300 may include a first set of raised structures 362 and a second set of raised structures 364. In one embodiment, the first set of raised structures 362 will have a width of about twice the standard width of raised structures and the second set of raised structures 364 will have a width equal to a standard raised structure. By way of specific example, the first set of raised structures 362 may have a width at the top portion of, for example, about 10-40 nm and the second set of raised structures 364 may have a width at the top portion of, for example, about 5-20 nm. The placement of the mandrels 330 during fabrication of the device 300 allows for selective placement of the raised structures 362 to enable wider fins to be placed where desired. The first set of raised structures 362 with a width of about twice the standard width allow for a lower capacitance at Vg=0V. By lowering the capacitance at Vg=0V the gate capacitance swing may increase and provide a larger tuning ratio of the device 300.

A portion of the raised structures 360, for example, the top portion 366, may be doped with pre-gate passive implants. The pre-gate passive implants may be placed into the channels to decrease the level of depletion and turn the device into a partially depleted fin, thereby giving the device 300 an even lower capacitance at Vg=0V. The implants may be n-type or a p-type, depending on if the device calls for NMOS- or PMOS-based varactors. The strength of the doped regions of the raised structures 362 affects the $C_{max}/C_{min}$ ratio. For example, a region having a high n+/p+ doping will have a large $C_{max}/C_{min}$ ratio. In addition, if a raised structure 362 had a longer height, then the structure 360 will have a higher depletion and a high $C_{max}/C_{min}$ ratio.

Figure 11:
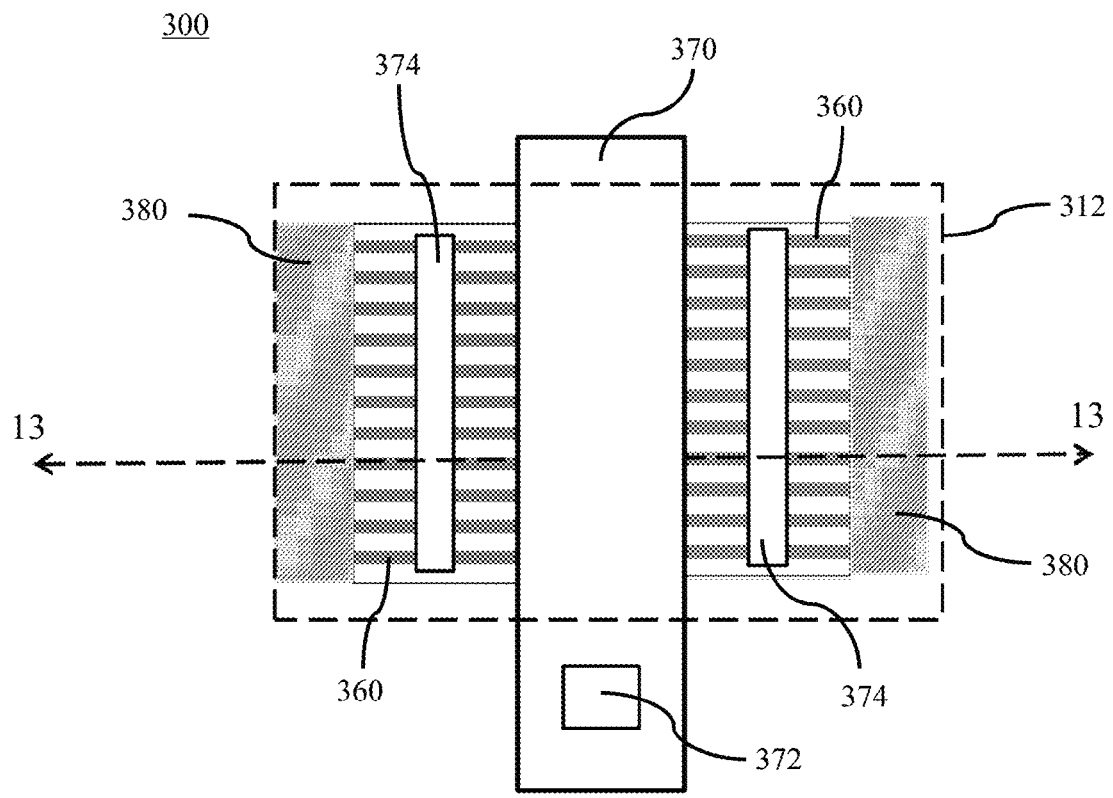
FIG. 11 depicts a top view of a portion of the intermediate semiconductor device of FIG. 10, in accordance with one or more aspects of the present invention.
Figure 12:
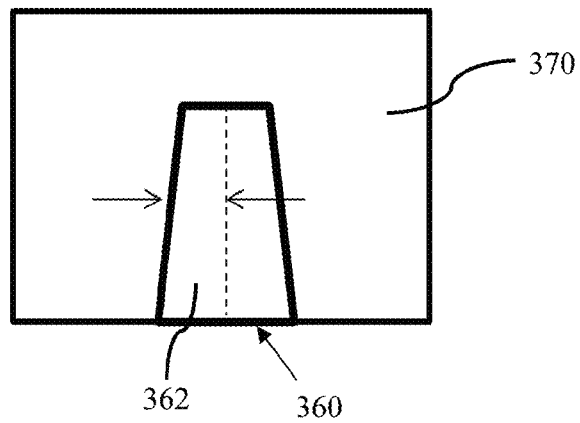
FIG. 12 depicts a cross section of a portion of the intermediate semiconductor device of FIG. 10, in accordance with one or more aspects of the present invention.
Figure 13:
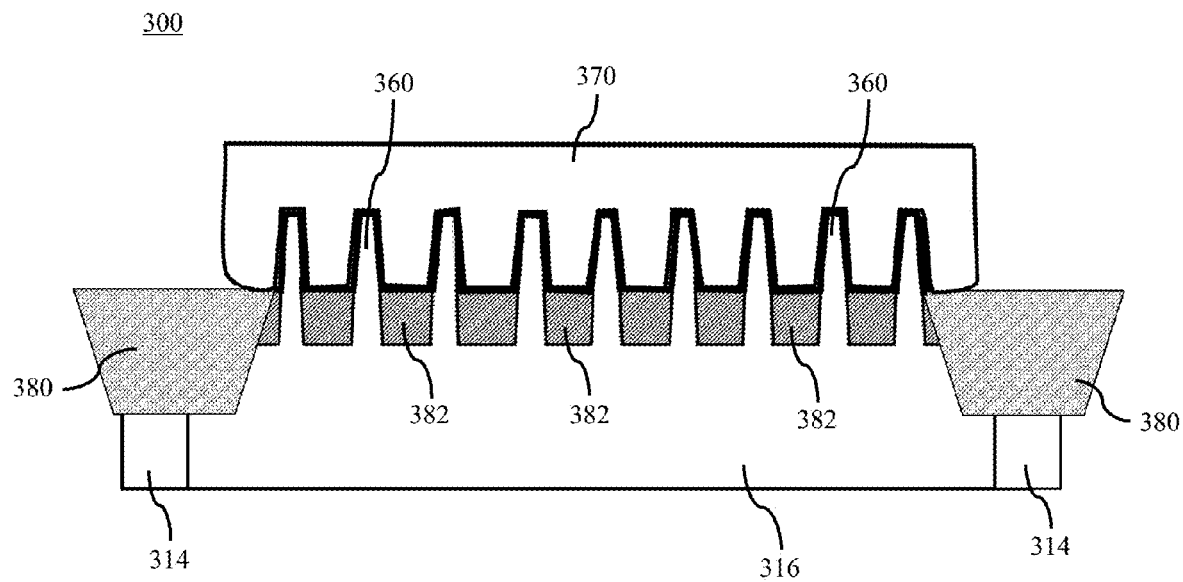
FIG. 13 depicts a cross section of a portion of the intermediate semiconductor device of FIG. 10 taken along line 13-13, in accordance with one or more aspects of the present invention.
Figure 14:
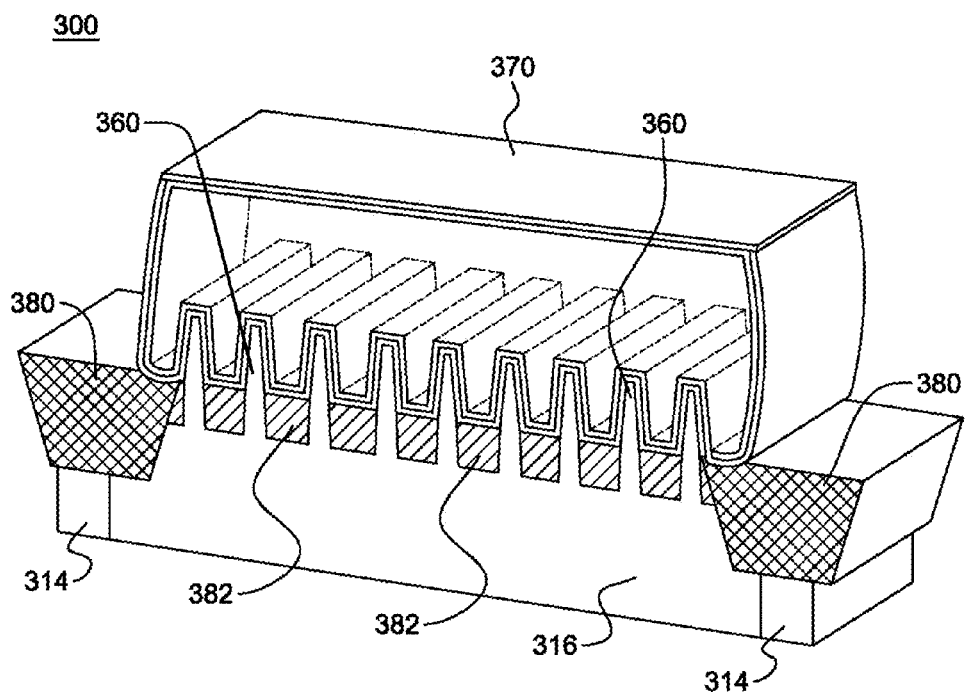
FIG. 14 depicts an isometric view of the intermediate semiconductor device of FIG. 10, in accordance with one or more aspects of the present invention.
Figure 15:
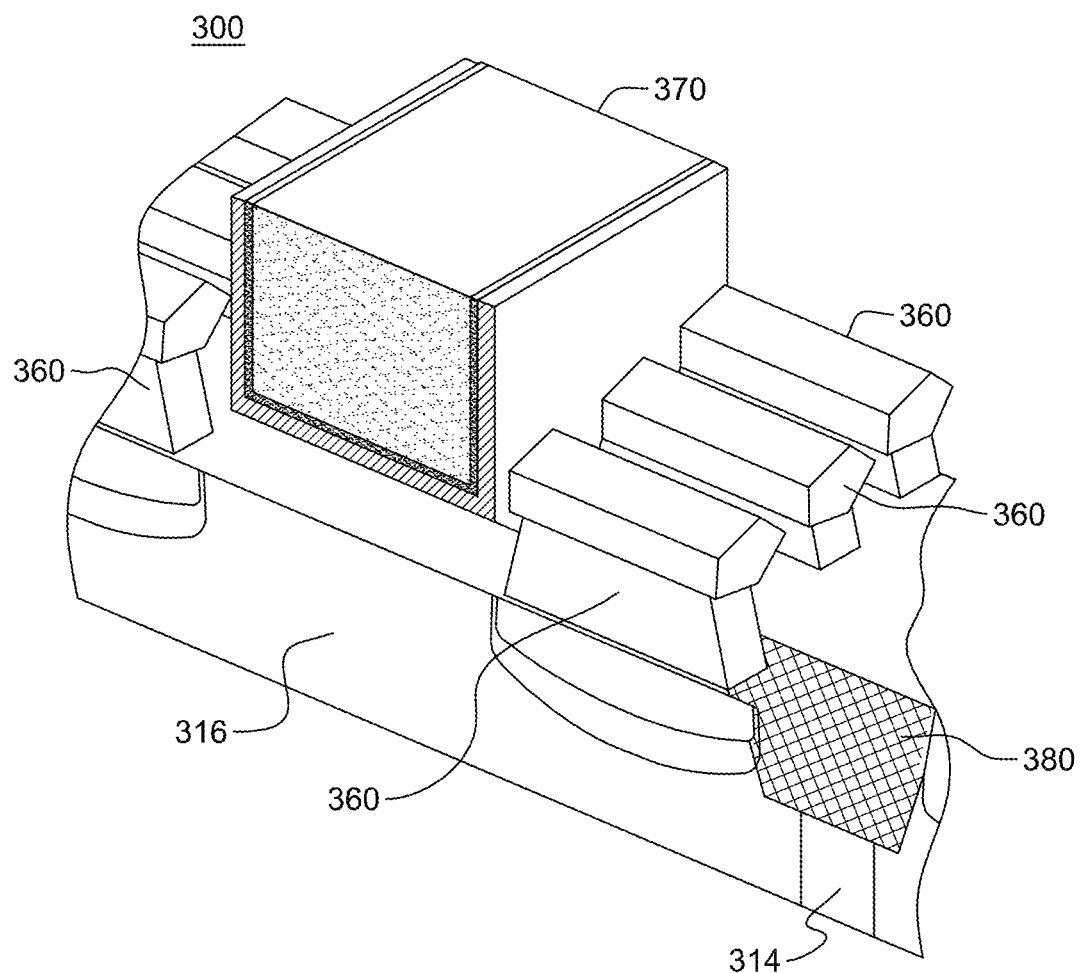
FIG. 15 depicts a second isometric view of the intermediate semiconductor device of FIG. 10, in accordance with one or more aspects of the present invention.

The substrate 310 may be doped to form a doped region 312, as shown in FIG. 11. The doped region 312 may include n-well regions 314 and p-well regions 316, as shown in FIGS. 13-15. Once the fin formation process is complete, the device 300 including a plurality of raised structures 360 will be passed down the line for additional processing. In one embodiment, as shown in FIGS. 10-15, isolation regions 380, 382 may be formed over the n-well regions 314 and p-well regions 316. Next a gate material 370 may be applied over the raised structures or fins 360 and the isolation regions 380, 382 of the device 300. The gate material 370 may be, for example, a polysilicon, a metal, or a combination of the two. In the depicted embodiment, the raised structures 362 may have, for example, a width twice the size of a standard fin width for the given size technology node. In addition, as shown in FIG. 11, contacts 374 may be applied, for example, over the fins 360 and the gate 370 to enable the formation of electrical connections with layers applied over the device 300.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device, comprising:
        a substrate;
        a dielectric layer over the substrate; and
        a plurality of mandrels formed on the dielectric layer;
    applying a spacer layer over the intermediate semiconductor device;
    etching the intermediate semiconductor device to remove a horizontal portion of the spacer layer to form at least one vertical portion of the spacer layer and to expose a top surface of the plurality of mandrels, the at least one vertical portion of the spacer layer comprising:
        a first set of spacers with a first width; and
        a second set of spacers with a second width, wherein the first width is about twice the size as the second width;
    removing the plurality of mandrels;
    etching the intermediate semiconductor device to remove at least a portion of the dielectric layer to form a first set of masks under the first set of spacers and a second set of masks under the second set of spacers;
    forming at least one first fin and at least one second fin, wherein the intermediate semiconductor device now comprises:
        a portion of the substrate;
        the at least one first fin extending above the portion of the substrate, the at least one first fin having a first fin width;
        the at least one second fin extending above the portion of the substrate, the at least one second fin having a second fin width and wherein the first fin width is about twice the size of the second fin width;
        the first set of masks positioned on the at least one first fin;
        the second set of masks positioned on the at least one second fin;
        the first set of spacers positioned on the first set of masks; and
        the second set of spacers positioned on the second set of masks; and
    removing the at least one vertical portion of the spacer layer and the dielectric layer.

2. The method of claim 1, wherein the first set of spacers remaining after removing the plurality of mandrels is a double spacer.

3. The method of claim 2, wherein the double spacer has a width ranging from about 10 nm to about 20 nm for a 20 nm technology node.

4. The method of claim 1, wherein the at least one fin has a double fin width.

5. The method of claim 4, wherein the double fin width ranges from about 10 nm to about 40 nm.

6. The method of claim 1, further comprising:
    forming a gate over the at least one fin.

7. The method of claim 6, further comprising:
    forming at least one contact over the gate; and
    forming at least one contact over the at least one fin.

8. The method of claim 1, further comprising:
    doping the at least one fin.

9. The method of claim 8, wherein doping the at least one fin comprises:
    implanting n+ into the at least one fin.

10. The method of claim 8, wherein doping the at least one fin comprises:
    implanting p+ into the at least one fin.

11. The method of claim 1, wherein the at least one first fin comprises:
    a bottom portion adjacent to the portion of the substrate; and
    a top portion on top of the bottom portion, wherein a width of the at least one first fin gradually increases from the top portion to the bottom portion; and
    wherein the at least one second fin comprises:
        a bottom portion adjacent to the portion of the substrate; and
        a top portion on top of the bottom portion, wherein a width of the at least one second fin gradually increases from the top portion to the bottom portion.

* * * * *